United States Patent
Geisberger

(10) Patent No.: US 6,617,185 B1
(45) Date of Patent: Sep. 9, 2003

(54) SYSTEM AND METHOD FOR LATCHING A MICRO-STRUCTURE AND A PROCESS FOR FABRICATING A MICRO-LATCHING STRUCTURE

(75) Inventor: Aaron Geisberger, Plano, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/071,772

(22) Filed: Feb. 7, 2002

(51) Int. Cl.$^7$ ............................................... H01L 21/00
(52) U.S. Cl. .............................. 438/24; 438/48; 438/54
(58) Field of Search ................. 438/54, 48, 24

(56) References Cited

U.S. PATENT DOCUMENTS

| | | | |
|---|---|---|---|
| 5,317,533 A | * 5/1994 | Quate et al. | 250/306 |
| 5,959,516 A | * 9/1999 | Chang et al. | 257/417 |
| 6,064,013 A | 5/2000 | Robinson | |
| 6,074,890 A | * 6/2000 | Yao et al. | 438/52 |
| 6,094,116 A | * 7/2000 | Tai et al. | 335/78 |
| 6,130,464 A | 10/2000 | Carr | |
| 6,164,762 A | * 12/2000 | Sullivan et al. | 347/56 |

FOREIGN PATENT DOCUMENTS

JP    11340189 A   * 12/1999   ......... H01L/21/306

OTHER PUBLICATIONS

"Lensless Latching–Type Fiber Switches Using Silicon Micromachined Actuators," Martin Hoffmann.

"A Novel Micromechanical Temperature Memory Sensor," Ken Goldman; The 8th International Conference on Solid–State Sensors and Actuators, and Eurosensors IX; Jun. 25–29, 1995; pp. 132–135.

* cited by examiner

*Primary Examiner*—Eddie Lee
*Assistant Examiner*—Paul E Brock, II
(74) *Attorney, Agent, or Firm*—Haynes and Boone, LLP

(57) ABSTRACT

In one embodiment, the present invention is directed to a method of fabricating a micro-mechanical latching device, comprising: depositing a structural layer in a fabrication plane, wherein the first structural layer possesses a topography; depositing a sacrificial layer adjacent to the first layer such that the sacrificial layer conforms to the topography of the first layer; depositing a second structural layer that conforms to the topography of the first layer; removing the sacrificial layer; and using at least the first structural layer and second structural layer to fabricate the micro-mechanical latching device.

25 Claims, 4 Drawing Sheets

SYSTEM AND METHOD FOR LATCHING A MICRO-STRUCTURE AND A PROCESS FOR FABRICATING A MICRO-LATCHING STRUCTURE

BACKGROUND OF THE INVENTION

1. Technical Field

The present invention is directed to a system and method for latching a micro-structure and a process for fabricating a micro-latching structure.

2. Background

Various micro-mechanical systems and micro-electromechanical systems (MEMs) are known in the art to perform various mechanical tasks. For example, Ken Goldman and Mehran Mehregany disclose a temperature memory sensor that utilizes a micro-latching mechanism in their article, "A Novel Micromechanical Temperature Memory Sensor," presented at The International Conference on Solid-State Sensors and Actuators, Eurosensors IX, Stockholm, Sweden, (Jun. 25 . 29, 1995). The memory sensor utilizes two separately micro-machined semiconductor layers. The semiconductor layers are positioned parallel to each other with one layer slightly overlapping the other. The memory sensor utilizes bimorph actuation to latch the two layers. Specifically, when the temperature of the sensor exceeds a predetermined temperature by a sufficient amount, the bimetallic effect causes deflection of one of the layers with respect to the other. The deflection causes one layer to be latched due to the overlapping portion of the other layer. Accordingly, the latched layer cannot return to its original position, when the memory sensor device returns to the predetermined temperature.

The memory sensor configuration is useful for temperature sensing applications. However, this configuration is not appreciably useful for other applications for various reasons. For example, the latching occurs in the same direction as bimetallic layer movement. Moreover, the memory sensor configuration only provides two possible states. Also, the memory sensor does not efficiently utilize area associated with the device.

As another example, U.S. Pat. No. 6,130,464 to Carr discloses a latching structure implemented within a micro-accelerometer. The micro-accelerometer includes a mass disposed on a cantilever. In response to acceleration, the mass exerts force on the cantilever causing it to deflect and to retract laterally over a positioned notch. The positioned cantilever is prevented from retracting due to the notch and is, therefore, latched into its rest position. The positioned cantilever may also be released from the latched position by application of current to create a thermal gradient. Additionally, the micro-accelerometer may be implemented in an in-plane configuration or in an out-of-plane configuration.

The cantilever and notch configuration of Carr is useful for accelerometer applications. However, this configuration is not appreciably useful for other applications for various reasons. For example, the latching occurs within the plane of movement of the cantilever. The disclosed cantilever and notch configuration imposes an essentially linear configuration on the device. Moreover, a very limited number of latched positions are possible according to the disclosed cantilever and notch configuration. Additionally, the disclosed cantilever and notch approach does not efficiently utilize area associated with the device.

Another micro-latching device is disclosed by Martin Hoffinan, Peter Kopka, and Edgar Voges in "Lensless Latching-Type Fiber Switches Using Silicon Micromachined Actuators," 25th Optical Fiber Communication Conference, OFC 2000, Baltimore, Maryland, USA, Technical Digest, Thursday, Mar. 9, 2000, p. 250–252. In the fiber switching device, the optical fibers are positioned within "V-grooves" and moved into position using a bi-stable actuator. The latching mechanism presented is attributed to the bi-stable actuator that takes advantage of thermally buckled cantilevers. Since the actuator has two low-energy states it can be actuated into one of the low-energy positions and will remain in that position. The latch disclosed does not fasten, or mechanically connect, the fibers into position. Rather, the mechanics holding the fibers in position are dependent on the stiffness of the bi-stable actuator. Further, the bi-stable latch device does not efficiently utilize area associated with the device.

Another micro-latching device utilizes electrostatic force to selectively latch the device into its latched position. In general, electrostatic latches provide two plates to create a capacitor. Additionally, the two plates are held apart by structure that possesses mechanical stiffness (e.g., the structure provides a spring force). Charge is provided to each plate by creating a potential difference. Additionally, a mass may be associated with one of the plates. When the mass is accelerated, the mass exerts a force against the plate causing it to be translated. If the plate is translated toward the other plate, the electrostatic force between the plates increases. When the electrostatic force becomes greater than the force provided by the mechanical stiffness of the separation structure, the plates remain in the latched position.

Electrostatic latching also possesses several disadvantages. First, electrostatic latching is not a "power-off" latching mechanism. Specifically, when the potential difference between the capacitive plates is removed, the electrostatic force is removed and the device becomes unlatched. Additionally, the geometry of electrostatic latching devices is limited. Moreover, electrostatic latching devices do not efficiently utilize space.

BRIEF SUMMARY OF THE INVENTION

The present invention is directed to a system and method of latching a micro-device. In embodiments of the present invention, the micro-mechanical latch comprises at least two layers. The two layers are disposed according to a defined topography. Specifically, one of the layers may possess, for example, a recess or void. The second layer possesses a protrusion that conforms to the recess or void. When the second layer is co-located with the first layer such that the protrusion superimposes the recess or void, the second layer becomes latched. Specifically, the second layer is prevented from being translated, because the first layer is operable to transmit mechanical force.

Embodiments of the present invention may be fabricated utilizing known semiconductor processing technology. In accordance with embodiments of the present invention, a first layer is provided or grown. A hole, recess, or other suitable feature is cut or etched into the first layer utilizing any suitable micro-machining technique. A sacrificial layer is created or deposited to cover the first layer. Additionally, the sacrificial layer possesses sufficiently minimal thickness to avoid completely filling the hole, recess, or other topological structure of the first layer. A third layer is then deposited over the sacrificial layer. Accordingly, conformal deposition causes the third layer to possess a complementary topography. The sacrificial layer is removed by, for example, utilizing an etching solution. The first and third layers are thereby released and may be translated with respect to each other. The first and third layers may be latched by positioning the layers to associate the complementary topography of the third layer with the hole, recess, or other topological structure of the first layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1A:
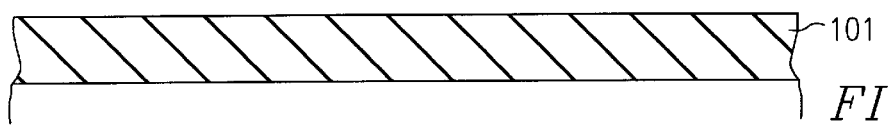
FIGS. 1A–1F depict exemplary arrangements of layers to illustrate fabrication of a micro-latching structure according to embodiments of the present invention.

FIGS. 1A–1F depict exemplary arrangements of layers to illustrate fabrication of a micro-latching structure according to embodiments of the present invention. FIG. 1A depicts layer 101 which has been deposited on a substrate. Layer 101 is the underlying structural layer that will be utilized, in part, to form a micro-latching device. Layer 101 may be provided or grown according to any suitable microfabrication technique. Suitable fabrication techniques include semiconductor processing techniques such as chemical vapor deposition (CVD). Layer 101 may comprise any suitable material, including, but not limited to, polycrystalline silicon. Layer 101 may remain attached to the substrate or may be eventually removed from substrate as desired.

Figure 1B:
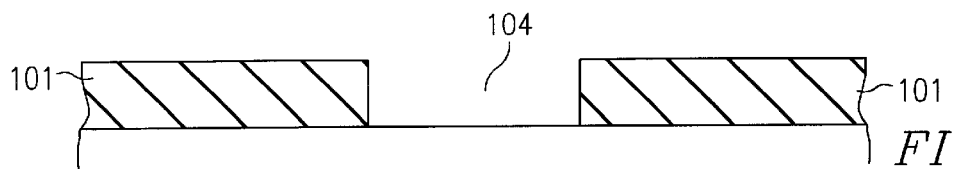

FIG. 1B depicts layer 101 after modification of layer 101 to possess a topography. In embodiments of the present invention, recess 104 may be provided to define the topography. Alternatively, a block or protrusion may be utilized to define the topography.

Figure 1C:
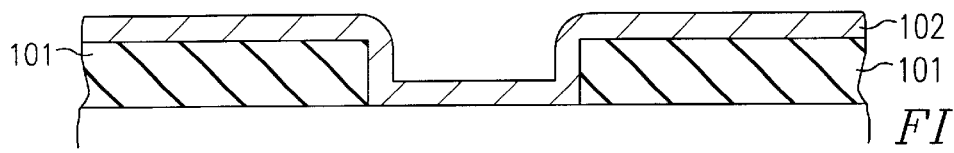

In FIG. 1C, layer 102 is deposited adjacent to layer 101. Layer 102 is a sacrifical layer or release layer. Layer 102 may be deposited on layer 101 utilizing suitable microfabrication techniques that are known in the art. Layer 102 may comprise any suitable material that possesses a relatively high etch rate in comparison to the etch rates of layers 101 and 103. For example, and without limitation, layer 102 may comprise phosphosilicate glass (PSG) or silicon dioxide. Layer 102 conforms to, but does not obscure, recess 104 of layer of layer 101.Layer 102 may be fabricated to possess a thickness of approximately 0.75 microns.

Figure 1D:
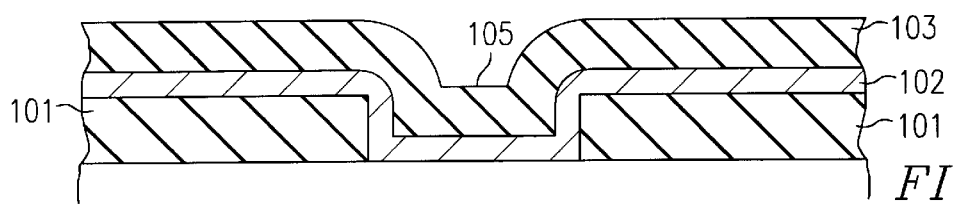

In FIG. 1D, layer 103 is deposited as a second structural layer. Layer 103 is adjacent to layer 102. Layer 103 may also comprise any suitable material including, but not limited to, polycrystalline silicon. Layer 103 may be deposited utilizing any suitable micro-fabrication technique. Layer 103 may be fabricated to possess a thickness of approximately 1.5 microns. When layer 103 is deposited, it conforms to the topography defined by layers 101 and 102. Specifically, the topography of layer 103 possesses protrusion 105 that is complementary to recess 104 of layer 101.

Figure 1E:
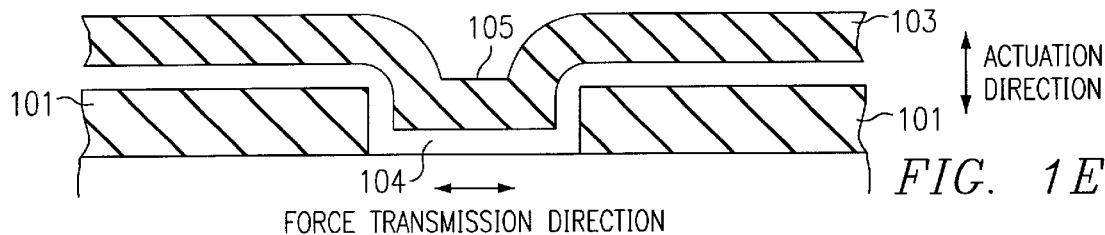

Since layer 102 is a sacrificial layer, it may be removed by appropriate etching techniques. For example, layer 102 may be etched away by utilizing a hydrofluoric acid (HF). FIG. 1E depicts a cross-section after removal of layer 102. After being released, layers 101 and 102 are no longer mechanically coupled and may be moved relative to each other. As shown in FIG. 1E, layers 101 and 102 may be translated with respect to each other by, for example, an actuator. The actuation direction is perpendicular to the planes of fabrication of layers 101 and 103. However, if layers 101 and 102 are positioned such that protrusion 105 of layer 103 superimposes recess 104, the layers are in a latched position. Specifically, mechanical force is transmitted in a direction in the plane of fabrication Accordingly, translation of layers 101 and 103, with respect to each other, does not occur in force transmission direction when layers 101 and 103 are latched.

It shall be appreciated that the materials and thickness described above for and 103 are merely exemplary. It shall be appreciated that any number of suitable materials may be utilized for layers 101, 102, and 103. Moreover, the thickness of layers 101, 102, and 103 may be varied as desired, so long as each thickness is appropriate for a selected micro-fabrication technique and permits conformal deposition.

Figure 1F:
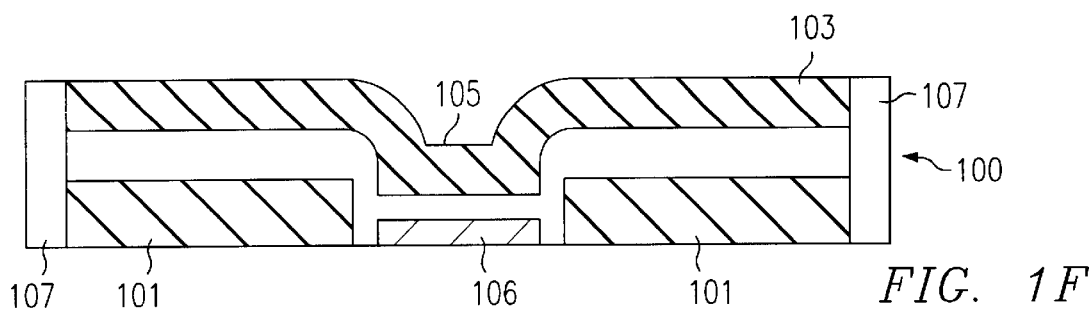

FIG. 1F depicts micro-latching device 100 implemented using, in part, layers 101 and 103. Micro-latching device further comprises actuator 106 that is operable to actuate layer 103 relative to layer 101. For example, an electrostatic force may be applied via actuator 106. Upon application of the electrostatic force, protrusion 105 may be positioned such that it protrudes into recess 104. In this position, layers 103 and 101 are latched. When the electrostatic force from actuator 106 is removed, layer 103 may be disengaged and translated relative to layer 101 by actuation means 107 (e.g., a thermal bimorph).

Figure 2A:
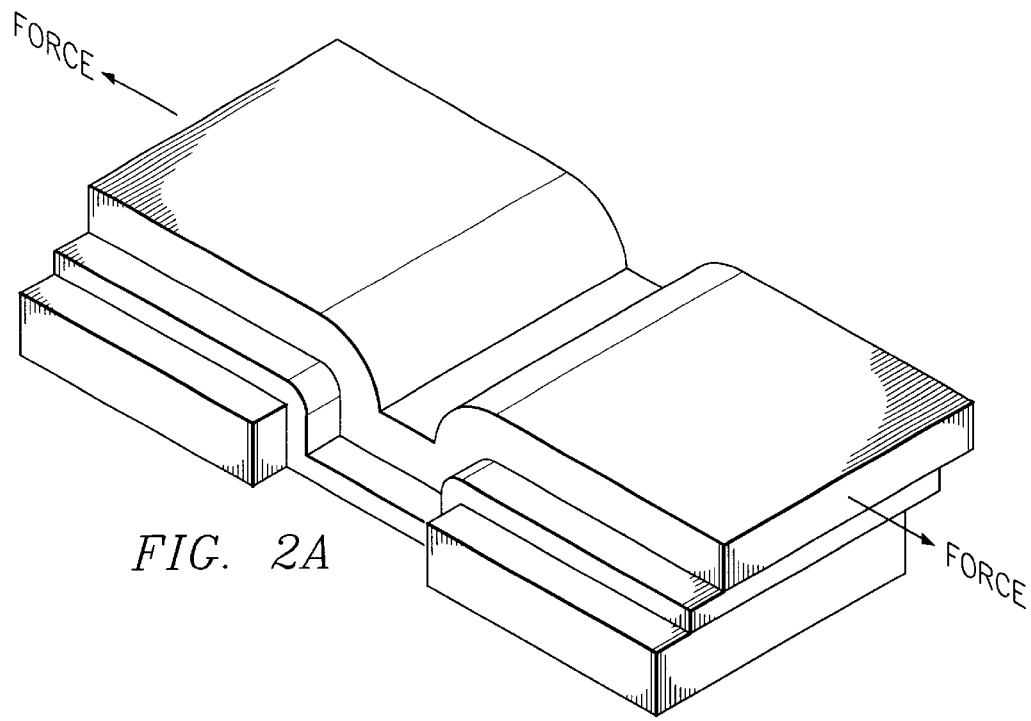
FIGS. 2A and 2B are isometric views of the arrangement of layers depicted in FIGS. 1A and 1E according to embodiments of the present invention.
Figure 2B:
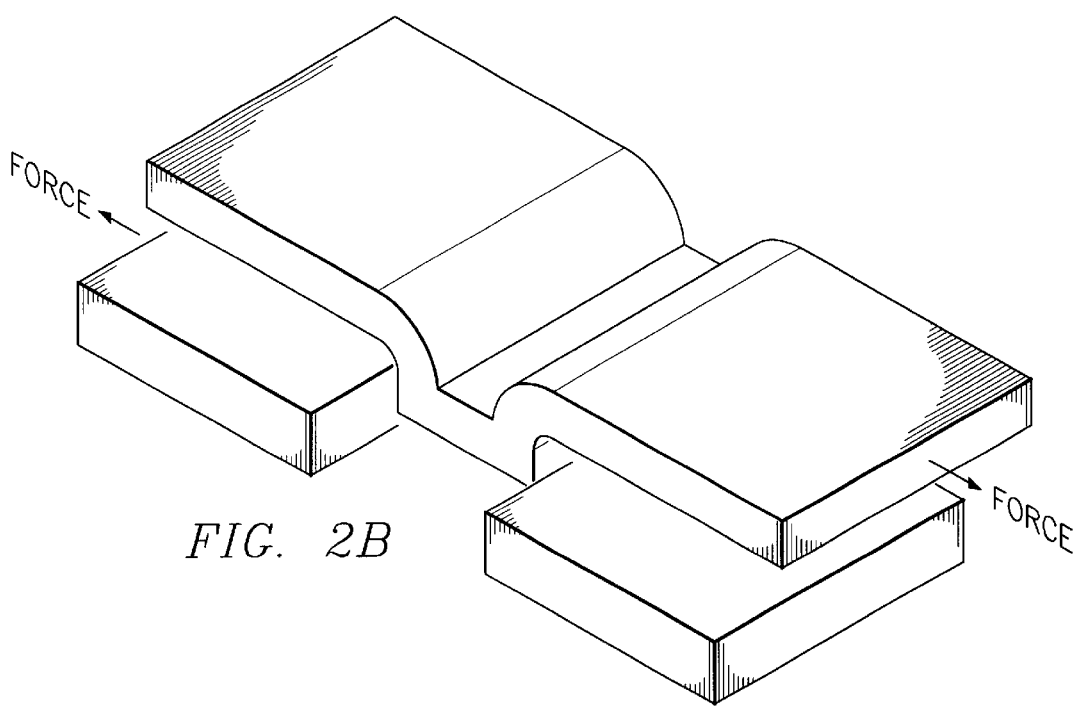

FIG. 2A depicts an isometric view of layers 101, 102, and 103 that corresponds to the cross-sectional view of FIG. 1D. FIG. 2B depicts an isometric view of layers 101 and 103 that corresponds to the cross-sectional view of FIG. 1E. FIGS. 2A and 2B also depict the force transmission direction associated with the layers.

Figure 3:
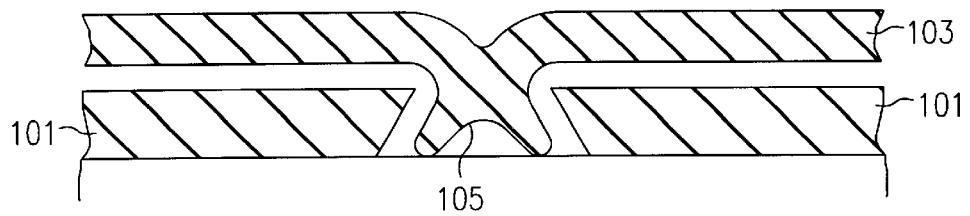
FIG. 3 depicts an arrangement of layers with one layer possessing a hole or recess with walls that are angled or tapered according to embodiments of the present invention.

FIGS. 1B, 2A, and 2B depict recess 104 of layer 101 with walls that are approximately parallel to each other. However, the present invention is not so limited. FIG. 3 depicts an embodiment of the present invention where layer 101 possesses recess 104 with walls that are angled or tapered. Specifically, recess 104 may be more narrow at its "top." Recess 104 may be implemented in this manner by utilizing micro-machining techniques that are known in the art. Additionally, protrusion 105 may also be more narrow at its "top" due to the conformal deposition. By shaping recess 104 in this manner, layers 101 and 103 may remain latched unless layer 103 is centered while being translated in the actuation direction.

Figure 4A:
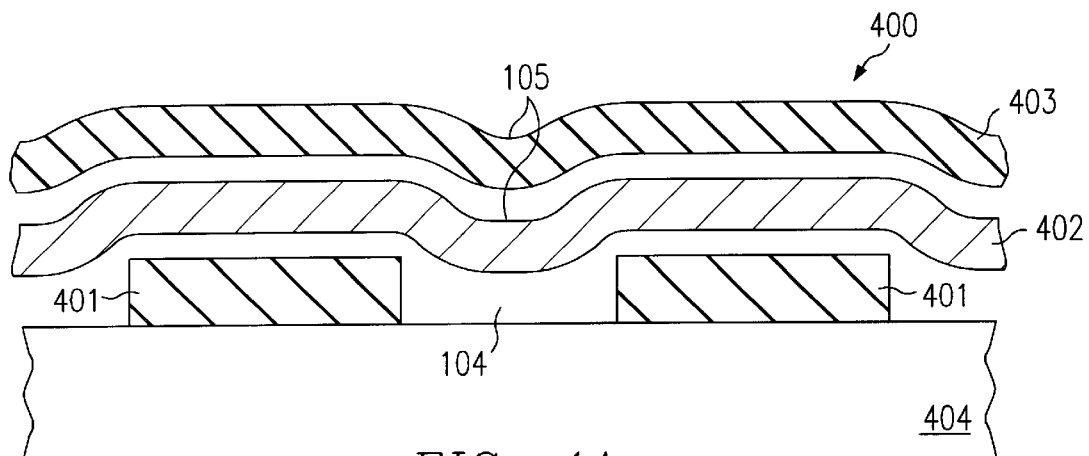
FIG. 4A depicts a cross-sectional view of an embodiment of the present invention that utilizes three layers to implement a micro-latching mechanism.

It shall be appreciated that the present invention is not limited to any specific number or arrangement of layers. Embodiments of the present invention may utilize any number of layers. For example, FIG. 4A depicts a cross-sectional view of an embodiment of the present invention that utilizes three layers to implement a micro-latching mechanism. Device 400 comprises two blocks 401 disposed on substrate 404. Blocks 401 are disposed in association to create recess 104. Layer 402 is immediately adjacent to blocks 401. Layer 402 possesses a topography that is complementary to the topography defined by blocks 401. Specifically, layer 402 comprises protrusion 105 that corresponds to recess 104. Likewise, layer 403 is adjacent to layer 402 and possesses a topography that is complementary to the topography defined by blocks 401. Also, device 400 may be implemented utilizing the layer deposition and etching techniques as discussed above with respect to FIGS. 1A and 1B.

Figure 4B:
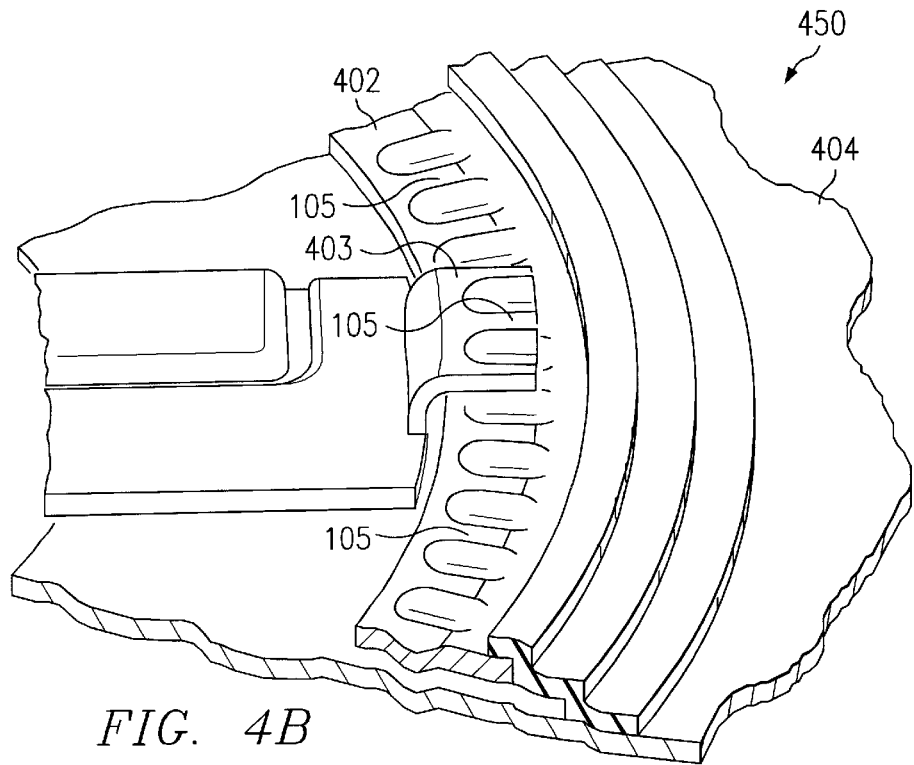
FIG. 4B depicts a rotator device that includes a micro-latching mechanism according to embodiments of the present invention.

FIG. 4B depicts an implementation of exemplary rotator device 450 utilizing a plurality of layers as shown in the cross-sectional view of FIG. 4A. Rotator device 450 comprises layer 402. Layer 402 comprises a complementary topography including a plurality of protrusions 105. Also, layer 402 is implemented as a ring with protrusions 105 disposed on an interior surface of the ring. Rotator device 450 further comprises layer 403 that also comprises a complementary topography (e.g., protrusions 105). Layer 403 is implemented as a mechanical cantilever (or "arm") to actuate layer 402. For example, an electrostatic force may be applied causing layer 403 to engage layer 402, thereby latching the layers. Then, by moving layer 403 in the actuation direction (i.e., by angularly displacing it), layer 403 may be operable to translate layer 402 via mechanical communication.

Figure 5:
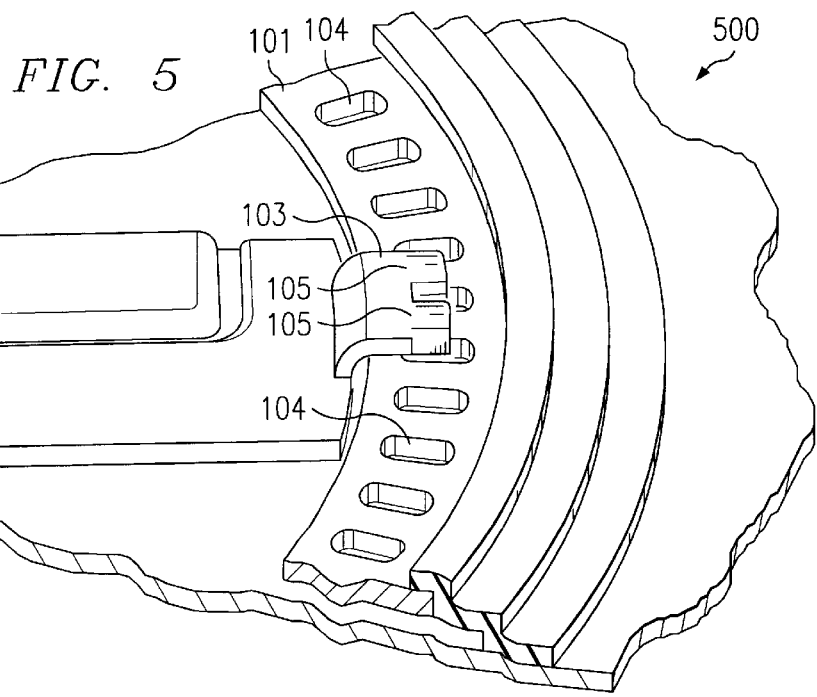
FIG. 5 depicts another rotator device that includes a micro-latching mechanism according to embodiments of the present invention.

FIG. 5 depicts another rotator device 500. Rotator device 500 is substantially similar to rotator device 450. However, rotator device 500 is implemented utilizing two layers as depicted in FIGS. 2A and 2B. In this case, layer 101 is implemented as a ring with recesses 104 disposed on an interior surface of the ring. Layer 103 is shaped as a cantilever (or "arm") to actuate layer 101. Specifically, protrusions 105 may be engaged in selected recesses 104 of layer 101 to thereby latch the layers. Layer 103 may be translated, thereby causing layer 101 to rotate.

Figure 6:
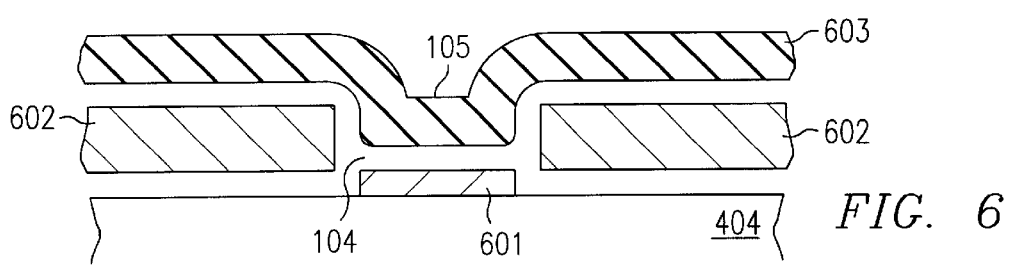
FIG. 6 depicts another arrangement of layers include a stop structure associated with a micro-latching mechanism according to embodiments of the present invention.

FIG. 6 depicts another embodiment of the present invention. FIG. 6 depicts stop 601 on substrate 404. Structural layer 602 is disposed above stop 601 Structural layer 602 comprises recess 104. Structural layer 603 possesses a topography that is complementary to the topography of structural layer 602. Specifically, structural layer 603 possesses protrusion 105 that also latches structural layer 602 with structural layer 603 when protrusion 105 is positioned in recess 104. Additionally, protrusion 105 may rest against stop 601 in the latched position. Stop 601 may be utilized to limit the amount of distance that protrusion 105 extends into recess 104 in the latched state.

Figure 7:
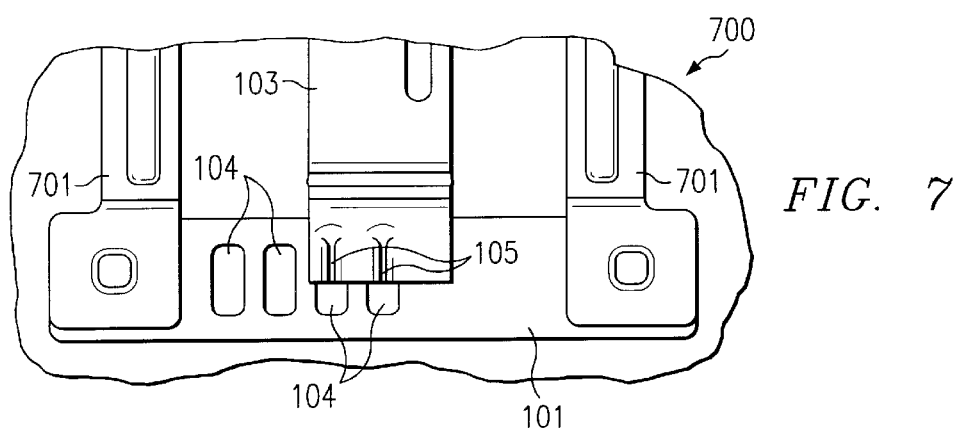
FIG. 7 depicts a thermal actuator device including a micro-latching mechanism according to embodiments of the present invention.

FIG. 7 depicts exemplary device 700 according to another embodiment of the present invention. Device 700 includes layers 101 and 103. Layer 101 is implemented as a linear bar with a plurality of recesses 104. Layer 103 is oriented parallel to structure of layer 101. Further, layer 103 possesses a topography that is complementary to layer 101. Specifically, layer 103 may be latched by placing protrusions 105 in one or ones of recesses 104. In this embodiment, layer 103 may be latched or unlatched by moving layer 101 with a suitable actuation force. Moreover, thermal bimorph actuator device 701 moves layer 101 relative to layer 103 in a direction that is perpendicular to the plane of actuation. Additionally or alternatively, an electrostatic force may be utilized to move layer 103 relative to layer 101 within the plane of fabrication if desired.

Device 700 may be repositioned by unlatching layer 103 from layer 101. For example, an electro-thermal force may be applied to layer 101, by applying current through actuator devices 701, to cause layer 101 to be pulled down toward the grounded substrate (not shown) until protrusions 105 are no longer engaged with ones of recesses 104. After unlatching, another thermal bimorph actuator (implemented via structural layer 103) may be utilized. A current may be applied to the other thermal bimorph actuator causing deflection of the thermal bimorph. The deflection causes layer 103 to move relative to layer 101. After layer 103 has been moved, layer 101 may be placed in the latched position by removing the electro-thermal force applied to layer 101. Additionally, it shall be appreciated that by utilizing this configuration, the components of device 700 remains in a latched position in a powered-off state. Accordingly, power consumption is not required to retain embodiments of the present invention in latched states.

Although embodiments of the present invention have described the initially fabricated layer as possessing a hole, recess, or void, it shall be appreciated that the present invention is not so limited. Specifically, embodiments of the present invention may dispose a single protrusion or block on the initially fabricated layer. The second structural layer may be conformally deposited so as to possess a complementary hole, recess, or void to latch over the protrusion or block of the initially fabricated layer.

Embodiments of the present invention may provide several advantages. First, embodiments of the present invention may be implemented utilizing any suitable geometry. Specifically, embodiments of the present invention are not limited to linear designs. Embodiments of the present invention enable a greater actuation density (as a function of area and/or volume) than existing latching mechanisms permit by, for example, fabricating the conformal latching mechanism as part of an actuator structure. Accordingly, embodiments may implement any number of advantageous applications on the micro-scale, including but not limited to, rotators and gear assemblies. Additionally, embodiments of the present invention facilitate "power-off" latching of micro-mechanical structures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a micro-mechanical latch, comprising:
   depositing a first structural layer, wherein said first structural layer defines a fabrication plane;
   modifying said first structural layer to cause said first structural layer to possess a topography;
   depositing a sacrificial layer adjacent to said first structural layer such that said sacrificial layer conforms to the topography of said first layer;
   depositing a second structural layer adjacent to said sacrificial layer such that said second structural layer conforms to the topography of said first structural layer, wherein one of said first structural layer and said second structural layer possesses a protrusion that conforms to a recess of said other layer;
   removing said sacrificial layer; and
   providing an actuator that selectively positions one of said first structural layer and said second structural layer in a first position that permits relative translation in a direction in said fabrication plane and in a second position that prevents relative translation in said direction in said fabrication plane due to placement of said protrusion in said recess.

2. The method of claim 1 wherein said step of modifying said first structural layer comprises micro-machining said recess in said first structural layer.

3. The method of claim 2 wherein said recess is micro-machined to possess tapered walls.

4. The method of claim 1 wherein said step of modifying said first structural layer comprises placing at least one block structure on said first structural layer.

5. The method of claim 1 wherein said step of removing said sacrificial layer comprises etching said sacrificial layer with an etching solution.

6. The method of claim 1 wherein said actuator actuates in a direction that is perpendicular to said fabrication plane.

7. The method of claim 1 wherein said actuator comprises:
   providing bimorphs to translate said second structural layer relative to said first structural layer in said direction in said plane of fabrication.

8. The method of claim 1 wherein said first structural layer possesses a plurality of topographical features, and wherein said plurality of topographical features are disposed in a ring to form a gear assembly in mechanical communication with said second structural layer.

9. The method of claim 1 wherein said actuator is a thermal actuator.

10. The method of claim 1 wherein said actuator is an electrostatic actuator.

11. The method of claim 1 wherein said first structural layer, said second structural layer, and said sacrificial layer possess a thickness that is on the order of 1 micrometer.

12. The method of claim 1 wherein said actuator positions the one of said first structural layer and said second structural layer in said second position in a power-off mode.

13. A method of fabricating a micro-mechanical latch, comprising:
   providing a first structural layer, wherein said first structural layer defines a fabrication plane, and wherein said first structural layer possesses a topography;
   providing a second structural layer that conforms to the topography of said first structural layer, wherein one of said first structural layer and said second structural layer possesses a protrusion that conforms to a recess of said other layer; and
   providing an actuator that selectively positions one of said first structural layer and said second structural layer in a first position that permits relative translation in a direction in said fabrication plane and in a second position that prevents relative translation in said direction in said fabrication plane due to placement of said protrusion in said recess.

14. The method of claim 13 wherein said step of providing a first structural layer comprises micro-machining said recess in said first structural layer.

15. The method of claim 14 wherein said recess comprises tapered walls.

16. The method of claim 13 wherein said step of providing a first structural layer comprises depositing a protrusion on said first structural layer.

17. The method of claim 13 wherein said first structural layer comprises a plurality of topographical features disposed in a ring to form a gear assembly in mechanical communication with said second structural layer.

18. The method of claim 13 wherein said actuator is a thermal actuator.

19. The method of claim 13 wherein said actuator is an electrostatic actuator.

20. The method of claim 13 wherein said actuator actuates in a direction that is perpendicular to said plane of fabrication.

21. The method of claim 13 further comprising:

providing a bimorph structure to translate one of said first structural layer and said second structural layer in said direction in said plane of fabrication.

22. A method of fabricating a micro-mechanical latching device, comprising:

depositing a first structural layer, wherein said first structural layer defines a fabrication plane, and wherein said first structural layer possesses a topography;

depositing a sacrificial layer adjacent to said first structural layer such that said sacrificial layer conforms to the topography of said first layer;

depositing a second structural layer that conforms to the topography of said first structural layer, wherein one of said first structural layer and said second structural layer possesses a protrusion that conforms to a recess of said other layer;

removing said sacrificial layer; and using at least said first structural layer and second structural layer to fabricate said micro-mechanical latching device.

23. The method of claim 22 further comprising:

providing an actuator that selectively positions one of said first structural layer and structural layer in a first position that permits relative translation in a direction in ion plane and in a second position that prevents relative translation in said fabrication plane due to placement of said protrusion in said recess.

24. The method of claim 23 wherein said actuator actuates in a direction that is perpendicular to said plane of fabrication.

25. The method of claim 23 further comprising:

providing a bimorph structure to translate one of said first structural layer and said second structural layer in said direction in said plane of fabrication.

* * * * *

UNITED STATES PATENT AND TRADEMARK OFFICE
CERTIFICATE OF CORRECTION

PATENT NO.     : 6,617,185 B1                                              Page 1 of 1
DATED          : September 9, 2003
INVENTOR(S)    : Aaron Geisberger It is certified that error appears in the above-identified patent and that said Letters Patent is hereby corrected as shown below:

Column 2,
Line 8, the word "Hoffinan" should be spelled as -- Hoffmann --.

Column 4,
Line 37, the word "sacrifical" should be spelled as -- sacrificial --.
Line 46, the second "of layer" should be deleted.

Column 5,
Line 11, after the words "above for" insert -- layers 101, 102, --.

Column 10,
Line 18, after the words "layer and" insert -- said second --.
Line 20, please delete the word "ion" and insert instead -- said fabrication --.
Line 21, after the words "in said" insert -- direction in said --.

Signed and Sealed this

Eighteenth Day of November, 2003

JAMES E. ROGAN
*Director of the United States Patent and Trademark Office*